(12) United States Patent
Salato et al.

(10) Patent No.: US 7,355,368 B2
(45) Date of Patent: Apr. 8, 2008

(54) EFFICIENT IN-RUSH CURRENT LIMITING CIRCUIT WITH DUAL GATED BIDIRECTIONAL HEMTS

(75) Inventors: Maurizio Salato, Torrance, CA (US); Marco Soldano, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/454,514

(22) Filed: Jun. 16, 2006

(65) Prior Publication Data

US 2006/0232253 A1   Oct. 19, 2006

Related U.S. Application Data

(63) Continuation-in-part of application No. 11/202,134, filed on Aug. 11, 2005, now Pat. No. 7,276,883.

(60) Provisional application No. 60/600,914, filed on Aug. 12, 2004, provisional application No. 60/694,329, filed on Jun. 27, 2005.

(51) Int. Cl.
*G05F 1/613* (2006.01)
*G05F 3/16* (2006.01)

(52) U.S. Cl. .................... 323/222; 323/225; 323/908

(58) Field of Classification Search .............. 363/52, 363/53, 81, 89; 323/222–225, 266, 268, 323/285, 908
See application file for complete search history.

(56) References Cited

U.S. PATENT DOCUMENTS

| | | | |
|---|---|---|---|
| 4,546,401 A | 10/1985 | Svedberg | |
| 5,994,882 A | 11/1999 | Ma | |
| 6,400,579 B2 * | 6/2002 | Cuk | ............................. 363/16 |
| 6,882,551 B2 * | 4/2005 | Shimada et al. | .............. 363/79 |

* cited by examiner

*Primary Examiner*—Gary L. Laxton
(74) *Attorney, Agent, or Firm*—Ostrolenk, Faber, Gerb & Soffen, LLP

(57) ABSTRACT

A boost converter in accordance with an embodiment of the present application includes an input rectifying bridge adapted to rectify an input AC voltage, a first inductor connected to the input rectifying bridge, a output capacitor coupled to first inductor for connection to a DC bus, a first bidirectional semiconductor switch coupled between the output capacitor and the first inductor, a second inductor positioned adjacent to the first inductor with a first end connected to a common ground and a second bidirectional semiconductor switch positioned between the second inductor and the output capacitor. An inrush control device may be provided to control the first and second bidirectional semiconductor switches to prevent current inrush.

8 Claims, 5 Drawing Sheets

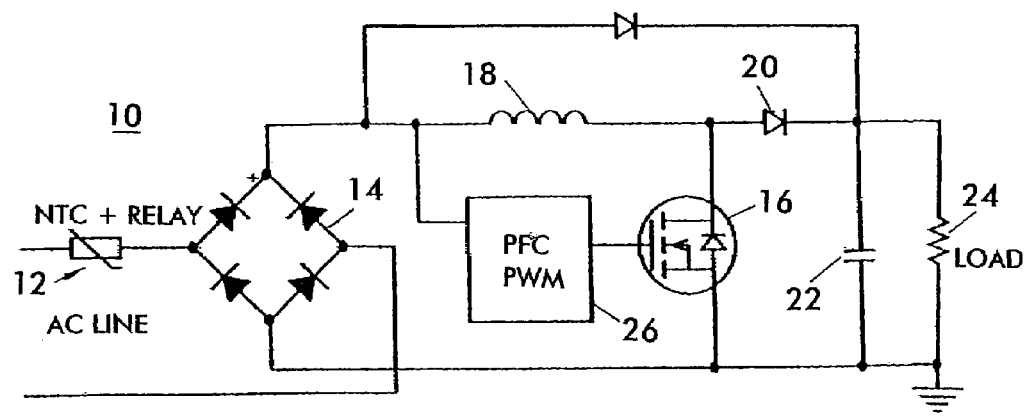
FIG. 1 *(PRIOR ART)*
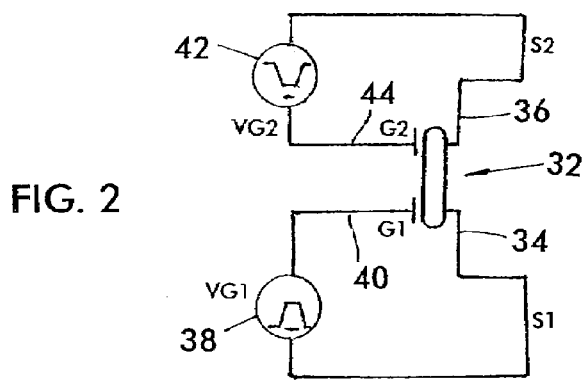
FIG. 2
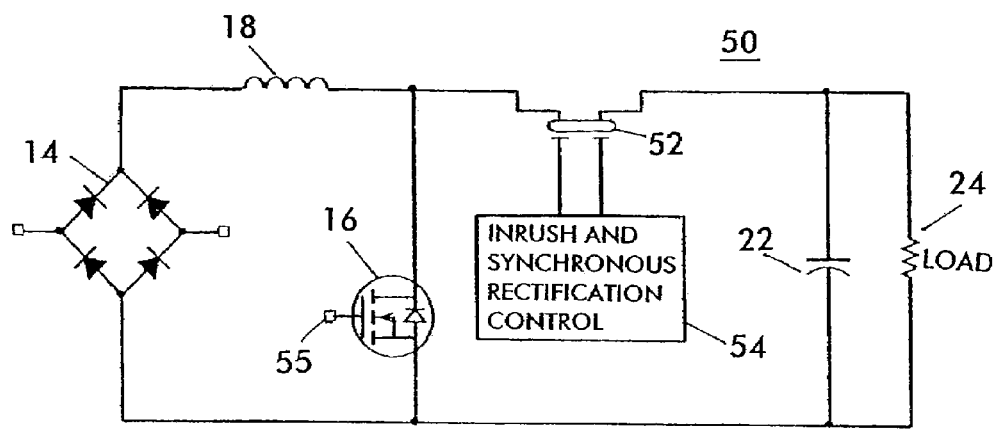
FIG. 3

EFFICIENT IN-RUSH CURRENT LIMITING CIRCUIT WITH DUAL GATED BIDIRECTIONAL HEMTS

REFERENCE TO RELATED APPLICATIONS

The present application is a continuation-in-part of U.S. patent application Ser. No. 11/202,134 entitled SELF-DRIVEN SYNCHRONOUS RECTIFIED BOOST CONVERTER WITH INRUSH CURRENT PROTECTION USING BIDIRECTIONAL NORMALLY ON DEVICE filed Aug. 11, 2005 now U.S. Pat. No. 7,276,883, which claimed benefit to and priority from U.S. Provisional Application 60/600,914 filed Aug. 12, 2004, the entire contents of each of which are hereby incorporate by reference herein.

The present application also claims benefit to and priority from U.S. Provisional Patent Application No 60/694,329 entitled EFFICIENT IN-RUSH CURRENT LIMITING CIRCUIT WITH DUAL GATED BIDIRECTIONAL HEMTs: REGULAR BOOST AND FLYBACK STRUCTURES INTEGRATION THROUGH CONTROLLED CASCODED RECTIFIER filed Jun. 27, 2005, the entire contents of which are hereby incorporated by reference herein.

BACKGROUND OF THE INVENTION

Relevant Art

Power factor correction (PFC) is required by international standards (EN61000-3-2) to reduce harmonic emissions in AC powered systems. The most common conventional solution employs an input rectifier bridge, followed by a boost switching converter, controlled by a voltage and a current loop. FIG. 1 shows a typical PFC rectifier stage, generally designated 10, including an input circuit 12, a diode bridge rectifier 14 feeding a MOSFET 16 through a boost choke 18, and a boost diode 20 which provides the output power through a capacitor 22. The load circuit, shown schematically as a resistor 24, is connected across capacitor 22.

Gate control for MOSFET 16, and PFC are provided by a suitable logic circuit 26. With this circuit, the voltage and current at the converter input 12 will be proportional at all times, generating the desired resistive behavior at the input of the system.

There are typically two problems that arise in boost topology configurations, namely high reverse recovery losses, and control of inrush current at startup. As to the first problem, when MOSFET 16 turns on during normal operation, the reverse recovery charge of boost diode 20 causes significant switching losses, seriously limiting the maximum switching frequency.

The second problem typically occurs at system startup, when the output capacitor 22 is discharged: the output capacitor is charged by the rectified AC line. The amplitude of the charging current is limited by the impedance of the input loop, resulting in a significant inrush current that can cause component failures.

In conventional topologies, there is no controllable switch in the path of the charging current by which the current path can be shut down if necessary. Conventional solutions for this problem take the form of negative temperature coefficient (NTC) or standard resistors with relays, SCR's, as illustrated on the input side of rectifier bridge in FIG. 1.

Specific conventional implementations of PFC in boost converters may be found in the following U.S. patents: U.S. Pat. No. 6,285,170 B1 to Matsumoto et al. for SWITCHING POWER SUPPLY; U.S. Pat. No. 5,420,780 to Bernstein et al. for APPARATUS FOR LIMITING INRUSH CURRENT; U.S. Pat. No. 5,994,882 to Ma for SYNCHRONOUS RECTIFIER FOR BOOST CONVERTERS. In all of these, however, the solutions address only one of the two main issues (inrush and reverse recovery losses) and they all use additional components which can not conveniently be fabricated as part of the converter IC. Clearly, a need exists for a better solution which addresses both problems, and also allows convenient integration.

SUMMARY OF THE INVENTION

The present invention seeks to satisfy the above-noted needs by substituting a bidirectional normally conducting semiconductor switch for the boost diode shown in FIG. 1. This known device is capable of conducting and blocking current in both directions, and is sometimes referred to as a four quadrants switch, because it is a device capable of conducting current and blocking voltage in both directions, and thus is capable of working in the four quadrants of the VI plane. A schematic diagram of such a device, generally denoted at 32, is shown in FIG. 2.

Here, the bidirectional current path is between a first source terminal 34 and a second source terminal 36. Control is provided by bias voltages provided by a first voltage source 38 connected between a first gate terminal 40 and source terminal 34 and a second voltage source 42 connected between a second gate terminal 44 and source terminal 36. A device of this kind is characterized by the fact that when a negative bias is applied across either one or both of the gate-source pairs, the device will be off. Only if the voltage at both gates is zero, can current flow between the two source terminals.

According to a first aspect of the invention, both a synchronous rectification function and a current inrush limiting function are implemented in a boost converter using a single bidirectional normally on switch. Preferably, according to this aspect of the invention, the boost converter employs a self-driven topology. Advantageously, the bidirectional switch and associated circuitry will be part of the IC which implements the boost converter itself.

According to a second aspect of the invention, a self-driven boost converter with inrush current limiting protection is implemented by replacing the conventional boost diode with a normally on bidirectional semiconductor switch having a low voltage Schottky diode connected between the gate and source terminals of the line-side pair.

According to a third aspect of the invention, inrush current limiting protection is implemented in a boost converter by replacing the conventional boost diode with a normally on bidirectional semiconductor switch using one gate (preferably the load-side gate) to turn off the bidirectional switch under control of a suitable logic circuit when the load current reaches dangerous levels. Both short circuit and overload protection can be provided in this manner.

Further according to the third aspect of the invention, there may be provided a low voltage Schottky diode connected between one of the gate and source terminal pairs of the bidirectional switch, preferably the line-side pair, with a second Schottky diode connecting the load-side gate terminal to a circuit protection logic circuit.

Circuits according to the various aspects of the invention require minimal addition of extra components, making the device economical and easily implemented as an IC with the rest of boost converter. Functional improvements over conventional practice are also obtained. For the synchronous rectification function, only the small forward voltage of the low voltage Schottky diode (0.2-0.3V) and the $R_{DSon}$ loss of the switch contribute to conduction losses, making the circuit very efficient. This represents an advantage even compared to the most advanced wide bandgap rectifier diodes (SiC and GaAs) which exhibit high conduction losses. Also, there are no reverse recovery losses, but only capacitive discharge of the switch capacitance.

For the inrush current limiting function, an important advantage is that the current path can be opened at any given time, providing a solid state fuse function. A complete and accurate inrush current control is therefore possible.

A boost converter in accordance with another embodiment of the present application includes an input rectifying bridge adapted to rectify an input AC voltage, a first inductor connected to the input rectifying bridge, an output capacitor coupled to first inductor for connection to a DC bus, a first bidirectional semiconductor switch coupled between the output capacitor and the first inductor, a second inductor positioned adjacent to the first inductor with a first end connected to a common ground and a second bidirectional semiconductor switch positioned between the second inductor and the output capacitor.

Other features and advantages of the present invention will become apparent from the following description of the invention which refers to the accompanying drawings. It is an object of the present invention to provide a

BRIEF DESCRIPTION OF THE DRAWING(S)

FIG. 1 is a schematic circuit diagram of a typical PFC rectifier stage having boost converter topology.

FIG. 2 is a schematic diagram representing the functionality of a bidirectional normally on switch.

FIG. 3 is a simplified schematic representation of a synchronous boost converter having inrush current limiting implemented according to the present invention.

Throughout the drawings, like parts are designated by the same reference number.

DETAILED DESCRIPTION OF PREFERRED EMBODIMENTS OF THE INVENTION

Figure 4:
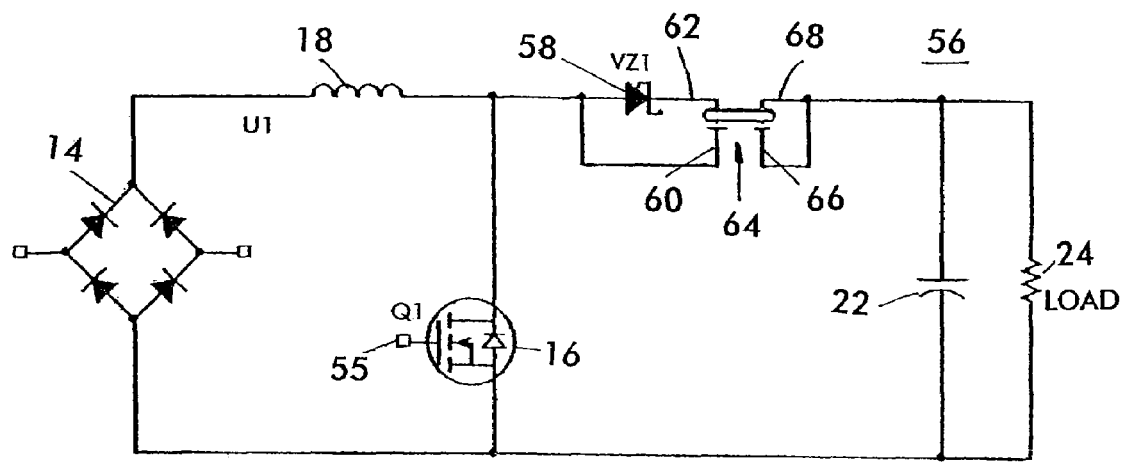
FIG. 4 is a schematic diagram of a self-driven synchronous rectifier boost converter according to the present invention.

Referring now to FIG. 3, the basic concept of a synchronous boost converter, generally designated at 50, has the same general architecture as the conventional circuit of FIG. 1 with a diode rectifier bridge 14, a low side MOSFET 16, a boost choke 18 and an output capacitor 22, to which a load circuit 24 is connected in parallel. The boost diode of FIG. 1, however, is replaced by a bidirectional normally on switch 52 of the type described above, and illustrated in FIG. 2. Inrush and synchronous rectification control is provided by a logic unit 54, which may be of any suitable or desired type, or as described in the exemplary embodiments described below, generates the appropriate control signals for switch 52. MOSFET 16 is driven in conventional fashion by suitable pulse width modulation logic (not shown).

A preferred exemplary, but non-limiting implementation employs a Schottky diode 58 connected between the line side gate and source terminals 60 and 62 of bidirectional switch 64. In this implementation, the load side gate 66 is not driven and is therefore connected directly to load side source 68.

Switch 64 needs to be able to block voltage in both directions. In a boost converter, when output capacitor 22 is discharged, the output voltage is lower than the input. However, when the circuit is operating, the output voltage is always larger than the input voltage. Correspondingly, switch 64 needs to be able to conduct current at least in one direction.

This functionality is obtained by use of low voltage Schottky diode 58 which generates the gate signal for turning on switch 64. When MOSFET 16 turns on, the current will be diverted into its drain. As soon as the voltage starts to build up across Schottky diode 58, switch 64 turns off, blocking the output voltage. When MOSFET 16 turns off, the opposite process takes place.

As previously noted, in the circuit of FIG. 4, the second gate 66 is not used and does not affect the operation. However, because gate 66 can be used to independently control the operation of switch 64, it can be used to implement inrush current protection, as illustrated in FIG. 5.

Figure 5:
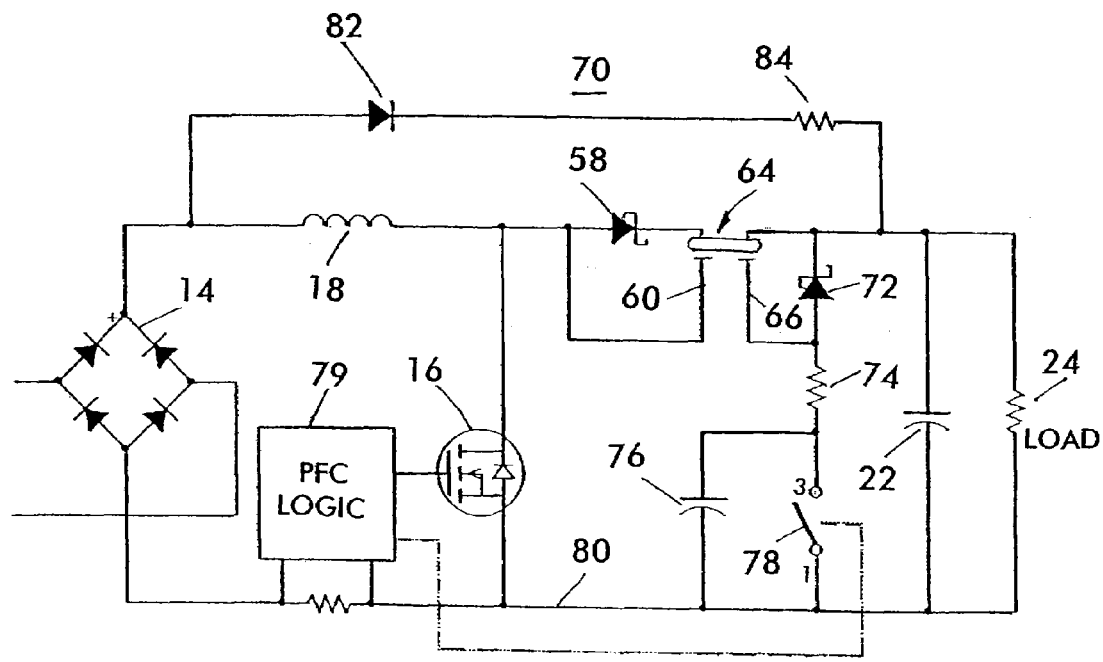
FIG. 5 is a circuit diagram of an implementation of the device of FIG. 4 providing inrush current protection.

The inrush current protection implementation circuit 70 illustrated in FIG. 5 differs from circuit 56 in that a diode (preferably a zener type) 72 is provided between the load side gate and drain terminals 66 and 68 of switch 64, and a current path to the low side rail 80 from MOSFET 16 is provided through a series combination of resistor 74 and capacitor 76. In addition, a switch 78 is connected across capacitor 76. This is operated by PFC logic circuit 78 to control the voltage at gate 66. In addition, an inrush diode 82 in series with an inrush resistor 84 may also be provided, as described below.

In operation, at system startup, when the AC line is applied to the system across bridge 14, output capacitor 22 is still discharged. Regardless of the position of switch 78, there will be 0V bias applied to the gate 66 and therefore the switch 68 will be "on".

As current starts flowing thru the inductor 18, diode 58 and switch 64 (assuming inrush diode 82 and resistor 84 not present), voltage will start to build up on the output capacitor 22. With the control switch 78 closed, the same output voltage will be present on the clamp diode 72 and therefore applied to the gate 66 of the switch 68. When the output voltage reaches the threshold voltage of switch 68, the switch will turn off, blocking the charging current path.

When the control switch 78 is open, capacitor 76 will start charging toward the same voltage as on capacitor 22, and gate 66 will track the voltage as capacitor 76 charges. The charging time is determined by the RC time constant of resistor 74 and capacitor 76 and can be made arbitrarily long, to limit inrush current to desired value. Alternatively, switch 78 can be pulse width modulated (PWM) to control the rate of rise of the input current. Inrush diode 82 and inrush resistor 84 can also be used to provide an extra path for charging the output capacitor 22.

Switch 78 can be closed at any time during operation, to open the current path from input to output. The PFC control will usually monitor the bus current. When the set current limit is reached, switch 78 will be closed, causing a negative bias on gate 66 and opening switch 64.

In accordance with another embodiment of the present application, inrush prevention may be accomplished by use of one or more bidirectional switching devices in a boost converter circuit. As is noted above, when the output capacitor 22 of FIG. 1, for example, is discharged, the output capacitor is charged, or recharged, by the rectified AC line. The amplitude of the charging current is limited by the impedance of the input loop, however, given the rather low impedance of the input loop, a significant inrush current is provided that can cause component failures. Similarly, the large inrush current may also trigger protective features of the main line and/or overheating.

Figure 6:
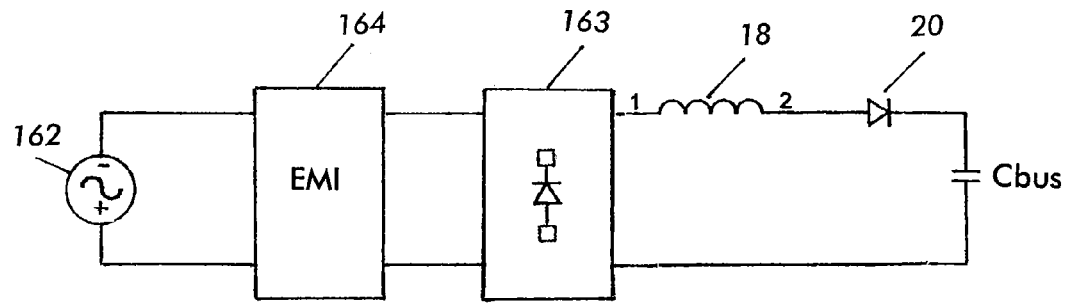
FIG. 6 is a schematic diagram representing the pre-capacitor charging loop.

FIG. 6 is a schematic diagram illustrating the capacitor pre-charge loop. That is, FIG. 6 illustrates schematically the path through which current travels to charge the output capacitor (capacitor 22 in FIG. 1), which is designated as the bus capacitor Cbus in FIG. 6 for convenience. The bus capacitor Cbus is so referred to since the voltage for the DC bus is preferably provided across this capacitor. Various devices may then be powered from the DC bus to provide the resistive load. From the AC voltage source 162 (AC main lines) current travels through an electromagnetic interference (EMI) canceling device 164 of any conventional or desired design which eliminates or minimizes the effects of electromagnetic interference. The current then travels through an appropriate rectifier 163, to the inductor 18 and the boost diode 20 to the bus capacitor Cbus. Thus, as can be seen in FIG. 6, the path between the capacitor Cbus and the AC voltage source 162 has a rather low impedance which results in rather large current peaks at start up. These peaks can not only damage components, they can also trigger protection features in the main lines and thus disrupt electrical service.

Figure 7:
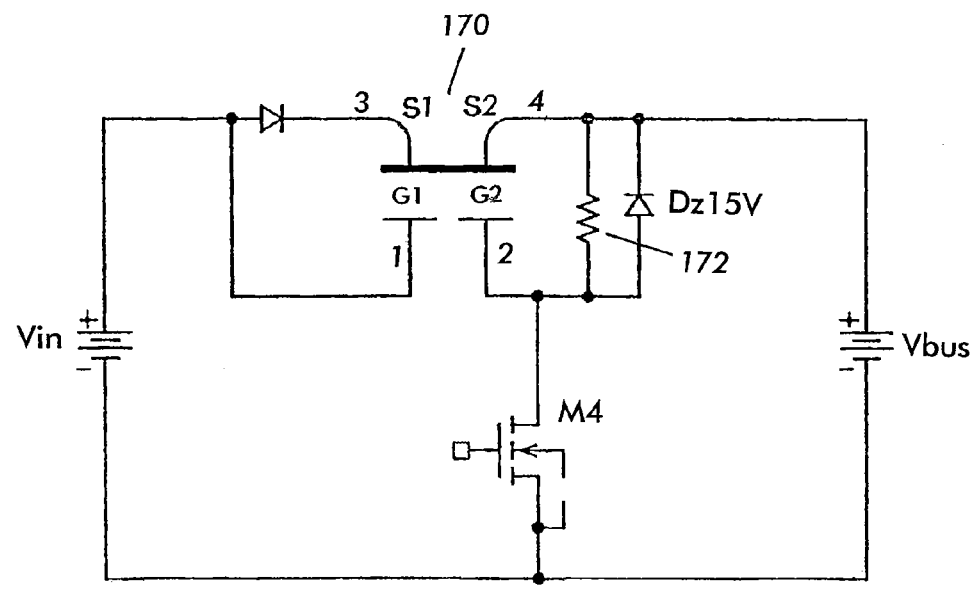
FIG. 7 is a diagram illustrating use of a bidirectional switching device to control current flow between disparate voltage sources in accordance with an embodiment of the invention.

FIG. 7 illustrates a circuit diagram illustrating the use of a bidirectional semiconductor switch 170 similar to that described above with reference to FIG. 2 to control current between disparate voltage sources Vin and Vbus. Vin and Vbus can be thought of simply as the input voltage and the output voltage or voltage across the DC bus. As illustrated in FIG. 7, the switch 170 includes two sources S1, and S2 with two associated gates G1 and G2. When Vin is larger than Vbus, such as at start up when the output capacitor, or bus capacitor has discharged, the source S2 is the most negative terminal of the switch 170. Thus, the switch 170 can be actively turned on and off utilizing the switch M4, the resistor 172 and the diode DZ to impose a negative voltage on G2. When the switch M4 is off, the gate G2 discharges through the resistor 172, and provided the voltage at G2 is not more negative than that at S2, the switch 170 stays on. When the switch M4 is on, the diode DZ clamps the gate-source voltage between G2 and S2 to −15V, thus providing the negative bias voltage necessary to turn the switch 170 off. It is noted that when Vin is less than Vbus, which is most of the time that the circuit is working after start up, SI is the most negative terminal of switch 170 and thus the gate G2 no longer affects the function of the switch 170.

Utilizing the concept described above, a boost converter circuit in accordance with another embodiment of the present application is described in detail with reference to FIG. 8. The circuit of FIG. 8 includes many of the same elements of the circuit of FIG. 5 and common reference numerals are used to refer to common features.

Figure 8:
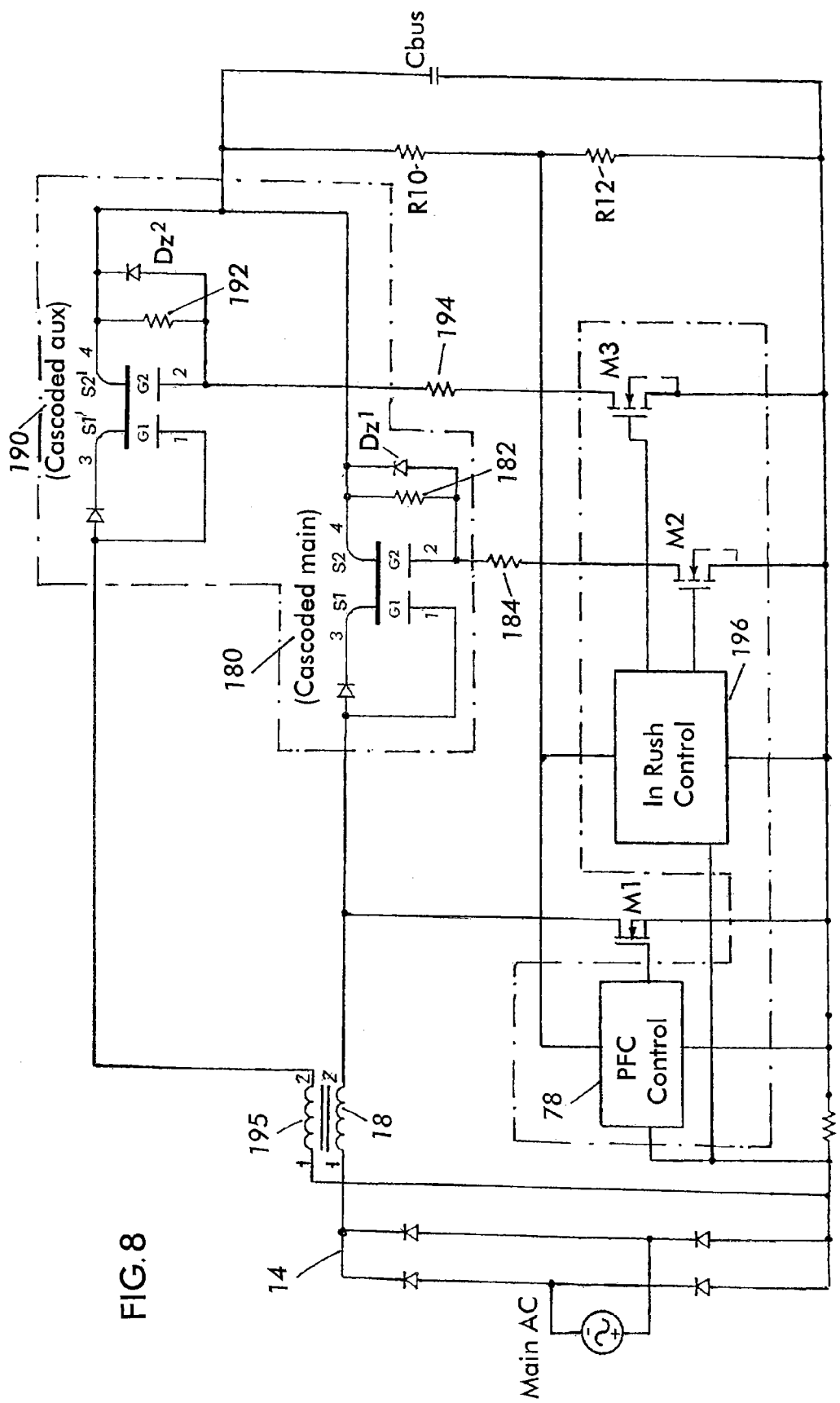
FIG. 8 is a is a simplified schematic representation of a synchronous boost converter having inrush current limiting implemented according to another embodiment of the present invention.

In the circuit of FIG. 8, the AC line voltage is applied across diode bridge 14 and to the inductor 18. Power factor correction may be provide by logic in PFC control device 78, for example, which controls switch M1. In the circuit of FIG. 8, the conventional boost capacitor is replaced by bidirectional semiconductor switch 180 (cascoded main) which is provided in a manner similar to that of switch 170 in FIG. 7 described above. The second gate G2 of the switch 180 is connected to an external circuit including two resistors 182, 184, a zenor diode $DZ^1$ and a power MOSFET M2. The inrush diode 82 and resistor 84 of FIG. 5 are replaced by a second bidirectional switch 190 (cascoded auxiliary) which is connected to another external circuit including two resistors 192, 194 a zener diode $DZ^2$ and MOSFET M3. A second inductor 195 is positioned adjacent to the inductor 18. A first side of the second inductor 195 coupled with primary inductor 18 is connected to ground, or the low side rail, while the other side is connected to the first source S1' of the second switch 190. The second sources S2, S2' of the first and second switches 180, 190 are connected to the output capacitor, which is again represented as the bus capacitor Cbus. An inrush control device 196 controls the MOSFETs M2 and M3 to control the first and second bidirectional switches 180, 190, respectively.

The circuit of FIG. 8 operates in two modes. In mode A, capacitor pre-charge, PFC control is inactive and the bus capacitor Cbus has been discharged and is to be charged. That is, mode A corresponds to start up. The inrush control device 196 keeps M3 off and actively switches M2. With M3 off, the switch 190 acts like a traditional diode. The inrush control modulates M2 to control inrush. The coupled second inductor 195 keeps the second switch 190 reverse biased.

While M2 is off, the switch 180 acts like a diode. Current flows from the main AC lines, through the bridge 14, the inductor 18, the switch 180 and to the bus capacitor Cbus to charge the capacitor. When M2 is turned on, the switch 180 is turned off in a manner similar to that described above with regard to FIG. 7. That is, the diode $DZ^1$ clamps the gate to source voltage between G2 and S2 of switch 180 to the bottom rail of the DC bus, thus providing the negative bias voltage necessary to turn the switch 180 off. The magnetic energy stored in the second inductor 195 allows current to flow through the second inductor 195 through the switch 190 to the bus Cbus. Thus, while current is still provided to charge the capacitor Cbus, the magnetic energy stored in inductor core discharges through winding 195 and switch 190.

In the second mode, normal PFC control, the inrush control device 196 keeps M2 off and M3 on. In this manner, the second bidirectional switch 190 is prevented from being turned on, thus disconnecting the second inductor 195 from the bus capacitor Cbus. The switch 180 on the other hand functions as a conventional boost diode. Since at this point, the bus diode Cbus has already been charged, the danger of inrush is no longer present and thus it is safe to allow switch 180 to operate as a normal diode.

The inrush control device 196 utilizes substantially the same feedback information as the PFC control device, including the voltage across the bus capacitor Cbus which may be provided from the point between resistors R10 and R12.

Figure 9:
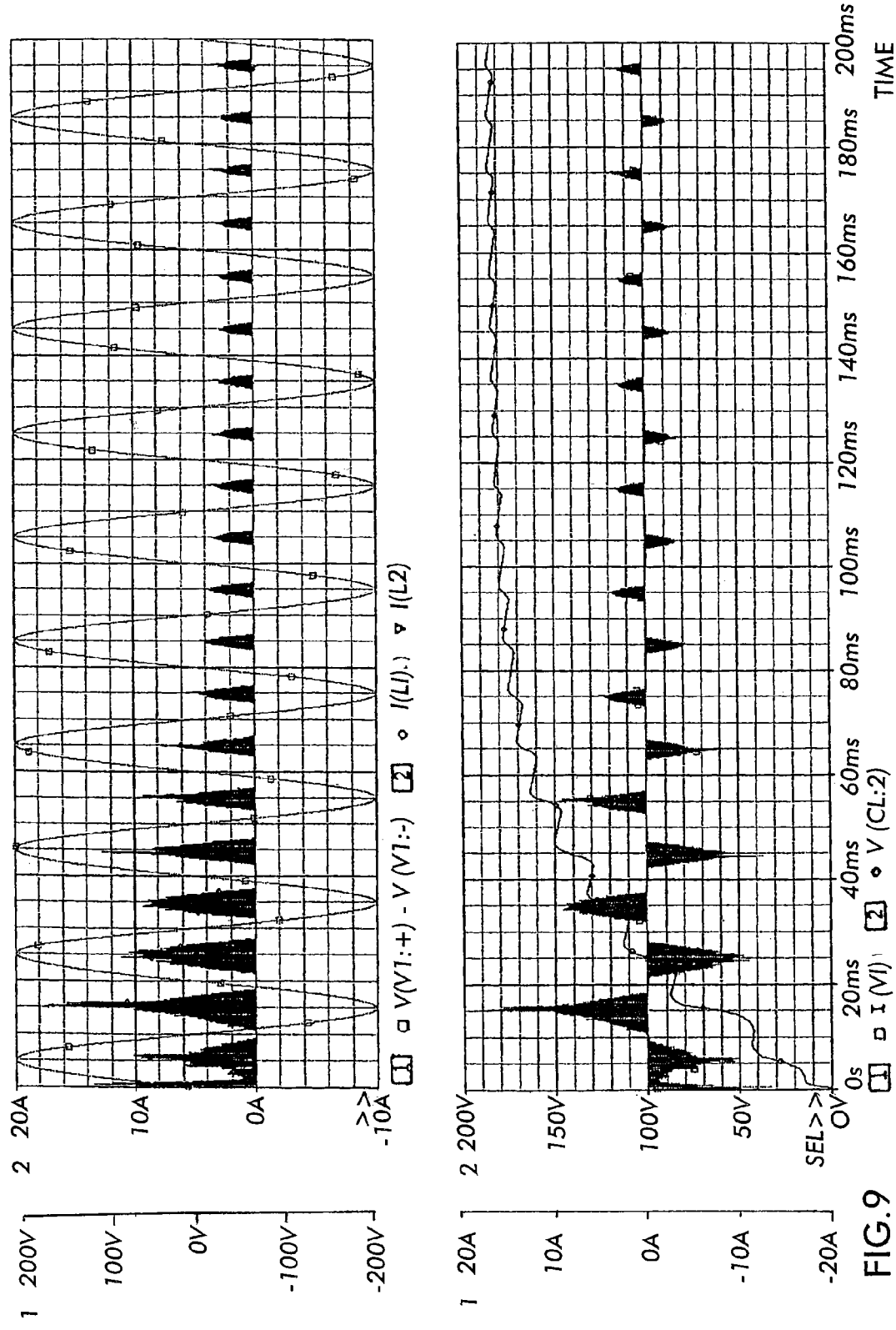
FIG. 9 is a graph illustrating results obtained by simulating the circuit of FIG. 8.

FIG. 9 is a graph illustrating the results obtained by simulating the circuit of FIG. 8. As can be seen, conduction periods are limited to the period of time when the input voltage is larger than the bus voltage across the bus capacitor Cbus.

Utilizing the circuit of FIG. 8, therefore provides inexpensive an reliable inrush current limiting. The use of the two bidirectional semiconductor switches 180, 190 in conjunction with the resistors 182, 184, 192, 194 and the diodes $DZ^1$ and $DZ^2$ along with the inrush control device 196 allows for the elimination of the expensive, unreliable and space-consuming electrochemical relay and inefficient NCT resistors that are conventionally used for inrush control. Further, inrush control could be implemented in a single enhanced PFC control device that provides both power factor correction and inrush control to further simplify the circuit of FIG. 8. The bidirectional semiconductor switches 180 and 190 act more like solid state switches which can be shut off in case of system failure which is more convenient than conventional fuses.

Although the present invention has been described in relation to particular embodiments thereof, many other variations and modifications and other uses will be apparent to those skilled in the art in light of the description herein. It is intended, therefore, that the invention not be limited by the specific disclosure herein, but that it be given the full scope permitted according to the appended claims.

What is claimed is:

1. A boost converter comprising:
   an input rectifying bridge adapted to rectify an input AC voltage;
   a first inductor connected to the input rectifying bridge;
   an output capacitor coupled to first inductor for connection to a DC bus;
   a first bidirectional semiconductor switch coupled between the output capacitor and the first inductor;
   a second inductor magnetically coupled to the first inductor with a first end connected to a common ground;
   a second bidirectional semiconductor switch positioned between the second inductor and the output capacitor;
   a first control switch connected to the first bidirectional semiconductor switch operable to turn the first bidirectional semiconductor switch on and off;
   a second control switch connected to the second bidirectional semiconductor switch operable to turn the second bidirectional semiconductor switch on and off; and
   an inrush control device operable to control the first and second control switches.

2. The boost converter circuit of claim 1, further comprising:
   a first switch zener diode connected between a first gate and a first source of the first bidirectional semiconductor switch, wherein the first gate and first source of the first bidirectional semiconductor switch are on the output capacitor side of the first bidirectional semiconductor switch;
   a first switch resistor connected between the first gate and the first source of the first bidirectional semiconductor switch in parallel with the first switch zener diode;
   a first intermediate resistor connected to each of the first gate, the first switch zener diode and the first switch resistor, wherein the first control switch is connected between the first intermediate resistor and a low side rail of the DC bus, such that, when on, it provides a negative voltage to the first gate of the first bidirectional semiconductor switch to turn it off.

3. The boost converter circuit of claim 2, further comprising:
   a second switch zener diode connected between a first gate and a first source of the second bidirectional semiconductor switch, wherein the first gate and the first source of the second bidirectional semiconductor switch are on the output capacitor side of the second bidirectional semiconductor switch;
   a second switch resistor connected between the first gate and the first source of the second bidirectional semiconductor switch in parallel with the second switch zener diode;
   a second intermediate resistor connected to each of the first gate of the second bidirectional semiconductor switch, the second switch zener diode and the second switch resistor, wherein the second control switch is connected between the second intermediate resistor and the low side rail of the DC bus, such that, when on, it provides a negative voltage to the first gate of the second bidirectional semiconductor switch to turn it off.

4. The boost converter of claim 1, wherein the inrush control device controls the second control switch to keep the second bidirectional semiconductor device on and controls the first control switch to turn the first bidirectional semiconductor switch on and off as appropriate when the input voltage is larger than the voltage across the output capacitor.

5. The boost converter of claim 1, wherein the inrush control device controls the second control switch to keep the second bidirectional semiconductor device off and controls the first control switch to keep the first bidirectional semiconductor switch on when the input voltage is less than the voltage across the output capacitor.

6. The boost converter of claim 1, further comprising:
   a power switch connected between a high side rail and the low side rail of the DC bus and positioned between the first inductor and the first bidirectional semiconductor switch; and
   a power factor correction control device operable to control the power switch to provide power factor correction for the boost converter.

7. The boost converter of claim 4, wherein the power switch is a power MOSFET.

8. The boost converter of claim 1, wherein the first and second bidirectional switches and other parts of the boost converter are fabricated on a single IC.

* * * * *